United States Patent
Mori

(10) Patent No.: US 7,417,487 B2
(45) Date of Patent: Aug. 26, 2008

(54) OVERHEAT DETECTING CIRCUIT

(75) Inventor: Kazuhisa Mori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 8 days.

(21) Appl. No.: 11/413,007

(22) Filed: Apr. 28, 2006

(65) Prior Publication Data
US 2006/0256494 A1    Nov. 16, 2006

(30) Foreign Application Priority Data
May 11, 2005   (JP) ............................. 2005-138186

(51) Int. Cl.
G01K 7/00   (2006.01)
(52) U.S. Cl. .................. 327/512; 374/163; 374/170; 374/178
(58) Field of Classification Search ............ 327/512, 327/513; 340/584; 361/103; 374/163, 170, 374/178
See application file for complete search history.

(56) References Cited
U.S. PATENT DOCUMENTS

| | | | | |
|---|---|---|---|---|
| 5,095,227 A | * | 3/1992 | Jeong | 327/512 |
| 5,444,219 A | * | 8/1995 | Kelly | 219/505 |
| 7,350,974 B2 | * | 4/2008 | Mikuni et al. | 374/178 |
| 2005/0041353 A1 | * | 2/2005 | Finney | 361/103 |
| 2006/0056486 A1 | * | 3/2006 | Mikuni et al. | 374/178 |
| 2006/0232313 A1 | * | 10/2006 | Favard | 327/205 |

FOREIGN PATENT DOCUMENTS

JP    6-169222    6/1994

* cited by examiner

*Primary Examiner*—N. Drew Richards
*Assistant Examiner*—Patrick O'Neill
(74) *Attorney, Agent, or Firm*—McGinn IP Law Group, PLLC

(57) ABSTRACT

An overheat detecting circuit according to an embodiment of the invention includes: a current source for generating a constant current; an overheat detecting element unit that operates with a first current generated in accordance with the constant current and generates a first voltage based on a semiconductor substrate temperature; and a detecting circuit unit that operates a second current generated in accordance with the constant current, and generates a second voltage corresponding to a predetermined semiconductor substrate temperature to detect overheating based on a voltage difference between the first voltage and a reference voltage and a voltage difference between the second voltage and the reference voltage.

20 Claims, 5 Drawing Sheets

US 7,417,487 B2

OVERHEAT DETECTING CIRCUIT

BACKGROUND OF THE INVENTION

1. Field of the Invention

The present invention relates to an overheat detecting circuit. In particular, the invention relates to an overheat detecting circuit for detecting a semiconductor substrate temperature higher than a predetermined temperature.

2. Description of Related Art

In recent years, a power LSI (Large Scale Integration) has been widely used for the purpose of generating high voltage or a large amount of current. The power LSI generates high output power and thus, involves a large self-heating amount. Hence, a semiconductor substrate temperature tends to increase. There is a fear that elements on the semiconductor substrate are broken due to the high semiconductor substrate temperature. To overcome this, the power LSI generally incorporates an overheat detecting circuit as a protective circuit to avoid abnormal temperature increase of the LSI to thereby protect the LSI from breakdown due to overheating. Japanese Unexamined Patent Application Publication No. 6-169222 discloses an example of such overheat detecting circuits.

FIG. 7 is a circuit diagram showing a conventional overheat detecting circuit 700. The overheat detecting circuit 700 of FIG. 7 has a current mirror circuit composed of a current determinative resistor R1 and transistors MN71 and MN72, diodes D1 to D5 as overheat detecting elements for generating a voltage V1, resistors R2 and R3 for determining a comparative reference voltage V2, and a comparator for comparing the voltage V1 and the comparative reference voltage V2. The operating voltage of the comparator ranges from a power supply voltage VCC and a reference voltage REF2 (VCC-6 V), and an operating voltage of the other elements ranges from the power supply voltage VCC and a reference voltage REF1 (VCC-2.5 V).

The conventional overheat detecting circuit 700 supplies a current determined with the current determinative resistor R1 to the overheat detecting element through the current mirror circuit, and then the comparator compares the voltage V1 with the comparative reference voltage V2 to obtain an output OT_L.

The diodes of the overheat detecting element cause a voltage drop of 0.6 V per diode when the semiconductor substrate is at ordinary temperature (for example, 25° C.). Further, the diode has a temperature characteristic of −2 mV/° C. Here, if a resistance value ratio between the resistors R2 and R3 is 3:2, the comparative reference voltage V2 equals (VCC-1.5 V).

The voltage V1 is lower than the comparative reference voltage V2, so a high-level voltage (for example, power supply voltage VCC) is output as the output OT_L until the semiconductor substrate temperature reaches an overvoltage detection temperature. Further, if the semiconductor substrate temperature exceeds the overheat detection temperature, that is, 175° C., a voltage drop per diode is 0.3 V, the voltage V1 equals (VCC-1.5 V). The semiconductor substrate temperature is much higher, and the voltage V1 exceeds (VCC-1.5 V). To that end, provided that the overheat detection temperature is 175° C., when the semiconductor substrate temperature exceeds 175° C., the voltage V1 becomes higher than the comparative reference voltage V2, so a low-level voltage (for example, VCC-6 V) is output as the output OT_L.

Through the aforementioned operation, the conventional overheat detecting circuit 700 changes an output voltage to detect overheating when the semiconductor substrate temperature exceeds the overheat detection temperature.

However, the conventional overheat detecting circuit 700 involves a variation factor, and exhibits a variation of ±10% of the reference voltage REF1 (VCC-2.5 V), a variation of ±10 mV of an input offset of the comparator, and a variation of ±40% of a resistance value of the current determinative resistor, for example. These variations lead to a variation in overheat detection temperature. For example, if all the variation factors vary to the maximum, an offset value of the overheat detection temperature is about ±25° C.

In some cases, the power LSI is used in high-temperature ambience such as an engine room of an automobile. Under such use environment, a high detection accuracy may be required for detecting the overheat detection temperature. For example, the circuit may be required to normally operate at temperatures of up to 175° C., and even upon the abnormal heat generation, the temperature should be 200° C. or smaller in some cases. To satisfy such conditions, even if the overheat detection temperature is 187.5° C., an offset value of the overheat detection temperature should be suppressed to ±12.5° C. or smaller. The conventional overheat detecting circuit 700 has a problem in that the overheat detection temperature largely varies and cannot be used for detection.

SUMMARY OF THE INVENTION

An overheat detecting circuit according to an aspect of the invention includes: a current source for generating a constant current; an overheat detecting element unit that operates with a first current generated in accordance with the constant current and generates a first voltage based on a semiconductor substrate temperature; and a detecting circuit unit that operates a second current generated in accordance with the constant current, and generates a second voltage corresponding to a predetermined semiconductor substrate temperature to detect overheating based on a voltage difference between the first voltage and a reference voltage and a voltage difference between the second voltage and the reference voltage.

According to the overheat detecting circuit of the present invention, the detecting circuit unit compares the voltage difference with the voltage difference between the second voltage and the reference voltage. That is, the voltage differences to be compared are both differences from the same reference voltage, so even if the reference voltage varies, the variation is cancelled out to ensure the constant detection temperature. Further, the first voltage and the second voltage increase/decrease in proportion to an increase/decrease in constant current. Thus, a change amount of the first voltage shows a constant relation to a change amount of the second voltage, so the overheat detection temperature is kept constant. Consequently, it is possible to provide an overheat detecting circuit having less variation in detection temperature.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
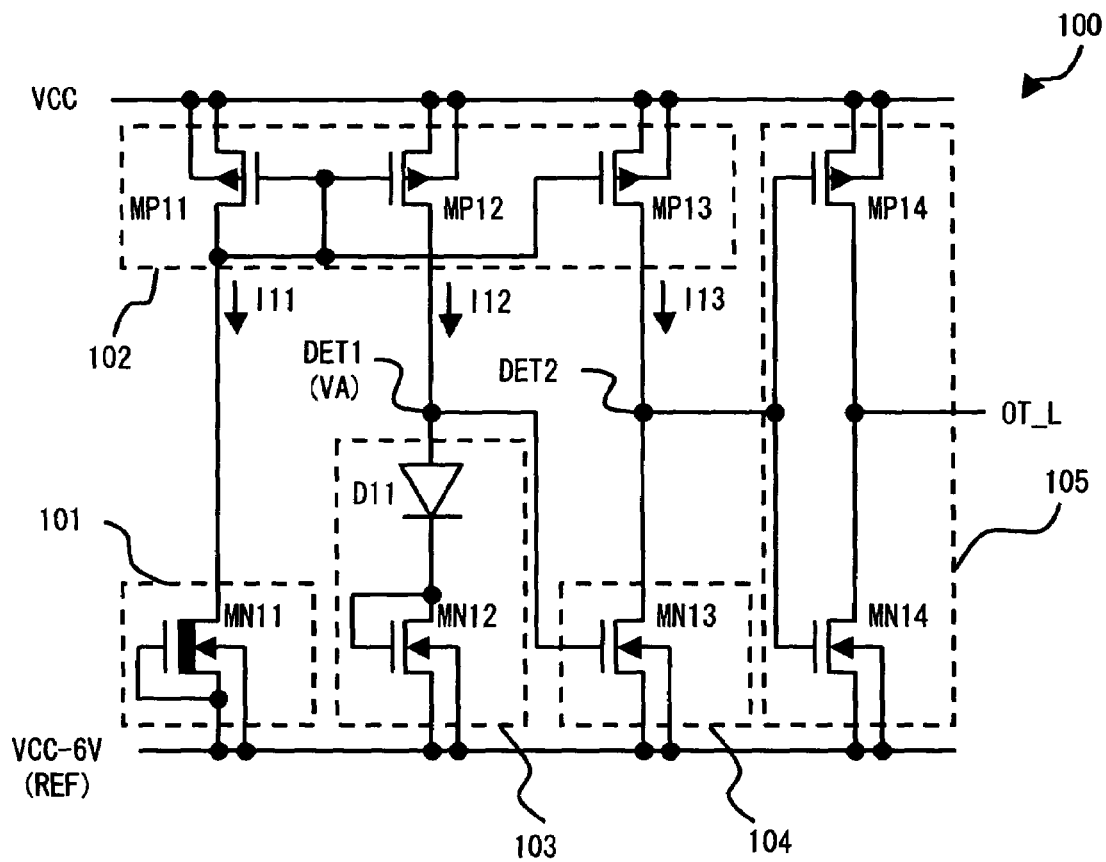
FIG. 1 is a circuit diagram showing an overheat detecting circuit according to a first embodiment of the present invention.

FIG. 1 shows an overheat detecting circuit 100 according to a first embodiment of the present invention. The overheat detecting circuit 100 of FIG. 1 includes a current source 101, a current mirror circuit unit 102, an overheat detecting element unit 103, a detecting circuit unit 104, and an inverter 105.

In this embodiment, the current source 101 is a depletion type NMOS transistor MN 11. The transistor MN 11 has a gate connected with a source that is applied with a reference voltage REF (for example, VCC-6 V), and has a drain connected with a drain of a PMOS transistor MP 11 of a current mirror circuit unit. The depletion type NMOS transistor MN 11 determines a value of a current I11 to be supplied to the PMOS transistor MP 11 based on the settings of a gate length L and a gate width W.

The current mirror circuit unit 102 includes PMOS transistors MP 11, MP 12, and MP 13. The PMOS transistors MP 11, MP 12, and MP 13 each have a source connected applied with a power supply voltage VCC. Further, the PMOS transistor MP 11 has a gate connected with a drain, and the PMOS transistors MP 12 and MP 13 each have a gate connected with the gate of the MP 11.

A drain of the PMOS transistor MP 12 is connected with the overheat detecting element unit 103. The PMOS transistor MP 12 supplies a current I12 in accordance with the current I11 supplied to the PMOS transistor MP 11 from the drain to the overheat detecting element unit 103. The drain of the PMOS transistor MP 13 is connected with the detecting circuit unit 104. The PMOS transistor MP 13 supplies a current I13 in accordance with the current I11 supplied from the PMOS transistor MP 11 from the drain to the detecting circuit unit 104.

The overheat detecting element unit 103 includes a diode D11 and an NMOS transistor MN 12. The NMOS transistor MN 12 has a source applied with the reference voltage REF, a gate connected with a drain, and the drain connected with a cathode of the diode D11. An anode of the diode D11 is connected with a drain of the PMOS transistor MP 12. A node between the diode D11 and the PMOS transistor MP 12 is DET1.

In this embodiment, the detecting circuit unit 104 is an NMOS transistor MN 13. The NMOS transistor MN 13 has a source applied with the reference voltage REF, a drain connected with a drain of the PMOS transistor MP 13 via a node DET2, and a gate connected with the node DET1. Incidentally, the NMOS transistor MN 13 and the NMOS transistor MN 12 are produced through substantially the same processes.

The inverter 105 includes a PMOS transistor MP 14 and an NMOS transistor MN 14. The PMOS transistor MP 14 has a source applied with the power supply voltage VCC. Further, the NMOS transistor MN 14 has a source applied with the reference voltage REF. The PMOS transistor MP 14 has a gate connected with the gate of the NMOS transistor MN 14 as well as a node between the PMOS transistor MP 13 and the NMOS transistor MN 13. The PMOS transistor MP 14 has a drain connected with the drain of the NMOS transistor MN 14, and a node therebetween is an output terminal (output OT_L).

Here, the terms reference voltage REF refers to a voltage generated by a constant voltage generator (not shown) based on the power supply voltage VCC.

The overheat detecting circuit 100 generates a high-level voltage as the output OT_L when the semiconductor substrate temperature is lower than the overheat detection temperature (for example, power supply voltage VCC), and generates a low-level voltage as the output OT_L when the semiconductor substrate temperature is higher than the overheat detection temperature (for example, reference voltage REF). The overheat detection temperature is the semiconductor substrate temperature at which the output voltage of the overheat detecting circuit 100 is switched from High level to Low level.

Hereinbelow, operations of the overheat detecting element unit 103 and detecting circuit unit 104 are described in detail. The overheat detecting element unit 103 generates a first voltage (for example, voltage VA) at the node DET1 based on the supplied current I12; the first voltage is calculated by adding a value of a forward voltage of the diode D11 to a threshold voltage Vth1 of the NMOS transistor MN 12. For example, if the semiconductor substrate temperature is 25° C. (ordinary temperatures), the threshold voltage Vth1 of the NMOS transistor MN 12 is 0.75 V, and the forward voltage of the diode D11 is 0.55 V, the voltage VA equals "VCC-6 V+1.30 V at ordinary temperatures.

The threshold voltage Vth1 of the NMOS transistor MN 12 and the forward voltage of the diode D11 have temperature characteristics of, for example, −2 mV/° C. That is, the threshold voltage Vth1 of the NMOS transistor MN 12 drops by 2 mV along with a temperature rise of 1° C. Further, as for the forward voltage of the diode D11 as well, the threshold voltage Vth1 drops by 2 mV along with a temperature rise of 1° C. Accordingly, a change rate of the voltage VA relative to the temperature is the total change rate (−4 mV/° C.) of the temperature characteristic of the threshold voltage Vth and the temperature characteristic of the forward voltage.

Further, the threshold voltage Vth1 of the NMOS transistor MN 12 and the forward voltage of the diode D11 change in accordance with the supplied current I12. For example, when the current I12 increases 10-fold, the threshold voltage Vth1 of the NMOS transistor MN 12 and the forward voltage of the diode D11 both increase by about 26 mV. Further, if the current I12 is decreased to ⅒, the threshold voltage Vth1 of the NMOS transistor MN 12 and the forward voltage of the diode D11 are both reduced by about 26 mV.

The threshold voltage Vth2 of the NMOS transistor MN 13 of the detecting circuit unit 104 is 0.97 V, for example, when the semiconductor substrate temperature is the ordinary temperature. The threshold voltage Vth2 is a second voltage, and has substantially the same temperature characteristic (−2 mV/° C.) as the NMOS transistor MN 12, for example. That is, the threshold voltage Vth2 drops by 2 mV along with the temperature rise of 1° C.

Figure 2:
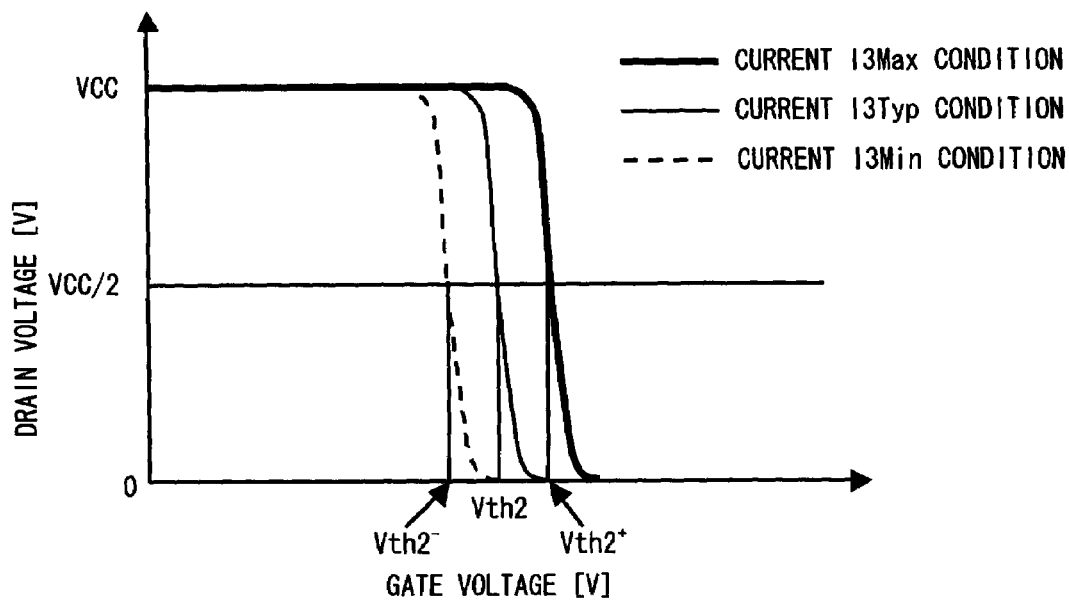
FIG. 2 is a graph showing input/output characteristics of a detecting circuit unit according to the first embodiment.

Further, the threshold voltage Vth2 of the NMOS transistor MN 13 is changed based on the supplied current I13. FIG. 2 is a graph showing an example of a change of the threshold voltage Vth2 of the NMOS transistor MN 13 relative to the current I13. In FIG. 2, the vertical axis represents a drain voltage at the time of supplying the current I13, and the horizontal axis represents a gate voltage of the NMOS transistor MN 13. Further, the thin line indicates a voltage change under the condition of a reference current amount (Typ condition), the heavy line indicates a voltage change under the condition of a larger amount of current (Max condition), and the broken line indicates a voltage change under the condition of a smaller amount of current (Min condition).

When the gate voltage is 0 V, the drain voltage corresponds to the power supply voltage VCC. When the gate voltage reaches a predetermined voltage level, the drain voltage is changed to a ground potential. When the gate voltage exceeds the predetermined voltage level, the drain voltage becomes the ground potential. The gate voltage at which the drain voltage equals VCC/2 is the threshold voltage Vth2 of the NMOS transistor MN 13. Since the NMOS transistor MN 13 is required to pass a larger amount of current if the current I13 increases, the threshold voltage Vth2 is a threshold voltage Vth2$^+$ higher than the Typ condition. Further, the NMOS transistor MN 13 only needs to pass a smaller amount of current if the current I13 decreases, the threshold voltage Vth2 is a threshold voltage Vth2$^-$ lower than the Typ condition.

The overheat detecting circuit 100 of this embodiment is set to change its output voltage when the semiconductor substrate temperature exceeds 190° C., for example. In the following description, the semiconductor substrate temperature that causes a change in output voltage of the overheat detecting circuit 100 is defined as the overheat detection temperature. The overheat detecting circuit 100 detects overheating when a voltage difference between the reference voltage REF and the voltage VA generated with the overheat detecting element unit exceeds a voltage difference between the reference voltage REF and the threshold voltage Vth2 of the NMOS transistor MN 13 in the detecting circuit unit. That is, when the semiconductor substrate temperature reaches 190° C., the voltage VA equals the threshold voltage Vth2. Further, when the semiconductor substrate temperature increases, the voltage VA is lower than the threshold voltage Vth2, so the output voltage of the overheat detecting circuit 100 is changed from the high level to the low level.

Figure 3:
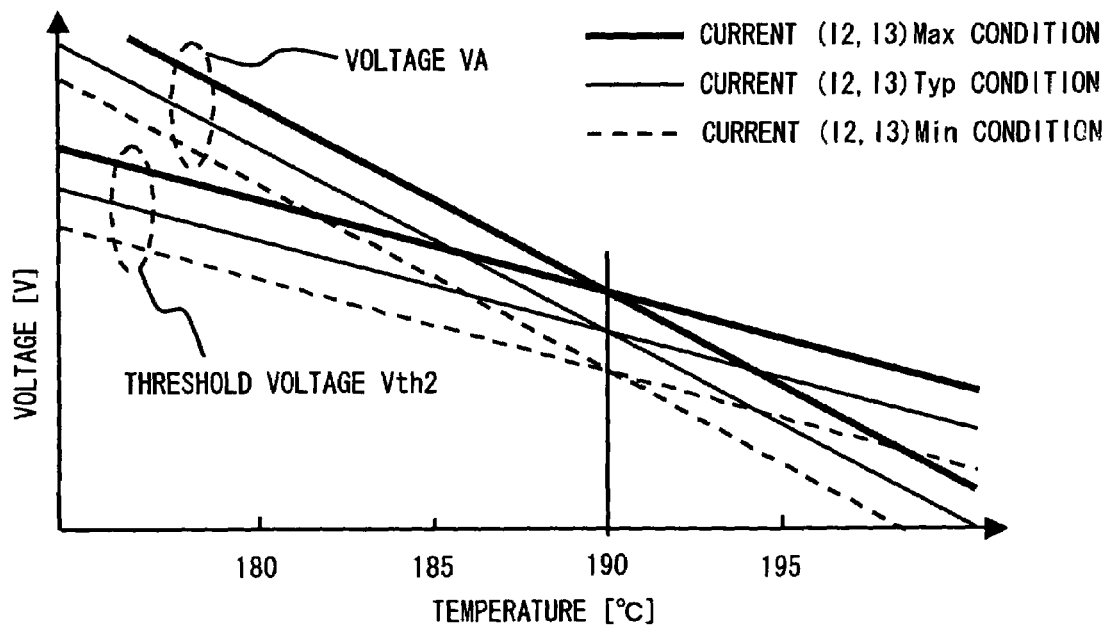
FIG. 3 is a graph showing temperature characteristics of a voltage Va and a threshold voltage Vth according to the first embodiment.

FIG. 3 shows a relation between the voltage VA and the threshold voltage Vth2. In FIG. 3, the thin line indicates a relation between the voltage VA and the threshold voltage Vth2 with the currents I12 and I13 of the Typ condition. The voltage VA gradually decreases at a rate of −4 mV/° C. along with the temperature rise. Further, the threshold voltage Vth2 decreases at a rate of −2 mV/° C. along with the temperature rise. The voltage VA is higher than the threshold voltage at the temperature lower than 190° C. The voltage VA equals the threshold voltage Vth2 at the temperature of 190° C. The voltage VA is lower than the threshold voltage Vth2 at the temperature higher than 190° C. In summary, a crossing point between the voltage VA and the threshold voltage Vth2 corresponds to the overheat detection temperature.

Further, the heavy line indicates a relation between the voltage VA and the threshold voltage Vth2 with the increased currents I12 and I13 (Max condition). Under the Max condition, the voltage VA and the threshold voltage Vth2 become higher than those of the Typ condition with the same temperature condition. However, the amounts of change in voltage VA and threshold voltage Vth increases and thus are cancelled out. Hence, a crossing point between the voltage VA and the threshold voltage Vth2 corresponds to the temperature of 190° C.

Further, the broken line indicates a relation between the voltage VA and the threshold voltage Vth2 with the decreased currents I12 and I13 (Min condition). Under the Min condition, the voltage VA and the threshold voltage Vth2 are lower than those of the Typ condition with the same temperature condition. However, amounts of change in voltage VA and threshold voltage Vth2 are decreases and thus cancelled out. Hence, a crossing point between the voltage VA and the threshold voltage Vth2 corresponds to the temperature of 190° C.

Next, an operation of the overheat detecting circuit 100 is described in detail. The overheat detecting circuit 100 operates with reference to the reference voltage REF. Thus, in the following description, a voltage refers to a potential difference from the reference voltage REF.

Description is given of an example where the semiconductor substrate temperature is lower than the overheat detection temperature. First, the current source 101 generates a current I11. The generated current I11 is supplied to the overheat detecting element unit 103 by the PMOS transistor MP 12 of the current mirror circuit unit 102 as a current I12 and supplied to the detecting circuit unit 104 by the PMOS transistor MP 13 as a current I13.

Here, under the condition of the same gate length L, the currents I12 and I13 are determined based on a relation among the gate width W1 of the PMOS transistor MP 11, the gate width W2 of the PMOS transistor MP 12, and the gate width W3 of the PMOS transistor MP 13. In this embodiment, the currents I12 and I13 are set to meet the relation of, for example, I11>I12>I13.

The overheat detecting element unit 103 generates the voltage VA at the node DET1 in accordance with an amount of the current I12. The voltage VA is 1.30 V if the semiconductor substrate temperature is the ordinary temperature.

The threshold voltage Vth2 of the NMOS transistor of the detecting circuit unit 104 is 0.97 V if the semiconductor substrate temperature is the ordinary temperature. Thus, when the voltage VA is 1.30 V, the gate voltage of the NMOS transistor MN 13 is higher than the threshold voltage Vth2, so a current flows. Hence, the current I13 supplied from the PMOS transistor MP 13 flows through the NMOS transistor MN 13, and the drain voltage of the NMOS transistor MN 13 is shifted to the low level.

The drain voltage of the NMOS transistor MN 13 is inverted by the inverter 105, and thus a high-level voltage is generated as the output OT_L.

Next, description is given of an example where the semiconductor substrate temperature is higher than the overheat detection temperature. First, the current source 101 generates the current I11. The generated current I11 is supplied to the overheat detecting element unit 103 by the PMOS transistor MP 12 of the current mirror circuit unit 102 as the current I12 and supplied to the detecting circuit unit 104 by the PMOS transistor MP 13 as the current I13.

The overheat detecting element unit 103 generates the voltage VA at the node DET1 in accordance with the current I12 amount. The voltage VA is 0.62 V when the semiconductor substrate temperature is 195° C.

In the detecting circuit unit 104, the threshold voltage Vth2 of the NMOS transistor is 0.63 V when the semiconductor substrate temperature is 195° C. Based on the above, if the voltage VA is 0.62 V, the gate voltage of the NMOS transistor MN 13 is lower than the threshold voltage Vth2, so no current flows. Thus, the drain voltage of the NMOS transistor MN 13 is shifted to the high level.

The drain voltage of the NMOS transistor MN 13 is inverted by the inverter 105, and thus a low-level voltage is generated as the output OT_L.

With overheat detecting circuit according to the first embodiment, the overheat detecting element unit 103 detecting circuit unit 104 applied with the same reference voltage REF detect the temperature. That is, the voltage VA generated with the overheat detecting element unit 103 corresponds to a potential difference from the reference voltage REF, and the threshold voltage Vth2 of the NMOS transistor MN 13 is also determined based on a potential difference from the reference voltage REF. The two voltages determined based on one reference voltage are used to detect a target temperature, making it possible to detect the temperature irrespective of the variation in reference voltage REF.

Further, the NMOS transistor MN 12 of the overheat detecting element unit 103 and the NMOS transistor MN 13 of the detecting circuit unit 104 are produced through substantially the same processes and thus are identical in terms of how much the threshold voltage varies. Therefore, the variation in voltage VA corresponds to the variation in threshold voltage Vth2. In other words, the overheat detection temperature can be set without considering an influence of the variation in a manufacturing process.

Further, the current I11 generated by the current source 101 is changed due to the variation in the manufacturing process and the temperature. However, according to the overheat detecting circuit 100 of the first embodiment, amounts of the currents I12 and I13 are determined based on a ratio in gate width between transistors of the current mirror circuit unit. That is, the currents I12 and I13 change in proportion to the change in current I11. As the current I12 increases, the current I13 proportionally increases. In other words, the voltage VA and the threshold voltage Vth2 change in proportion to the change in currents I12 and I13, so the voltage VA shows a constant relation to the threshold voltage Vth2. that is, the detection temperature can be set constant irrespective of the variation and change in current I11.

The overheat detecting circuit 100 of the first embodiment can reduce the number of elements as compared with the conventional overheat detecting circuit. Further, the conventional one requires two levels of reference voltage, the reference voltages REF1 and REF2, and thus requires two voltage generators. However, this embodiment requires only one reference voltage REF, so only one voltage generator suffices for generation of the constant voltage. Therefore, this embodiment enables reduction in chip area. That is, the overheat detecting circuit 100 of this embodiment can set the overheat detection temperature with a high accuracy even with a smaller chip area. The offset value of the overheat detection temperature is within a variation range of +0.7° C. to −2.1° C. relative to a preset value of 190.5° C. based on a simulation result.

Second Embodiment

Figure 4:
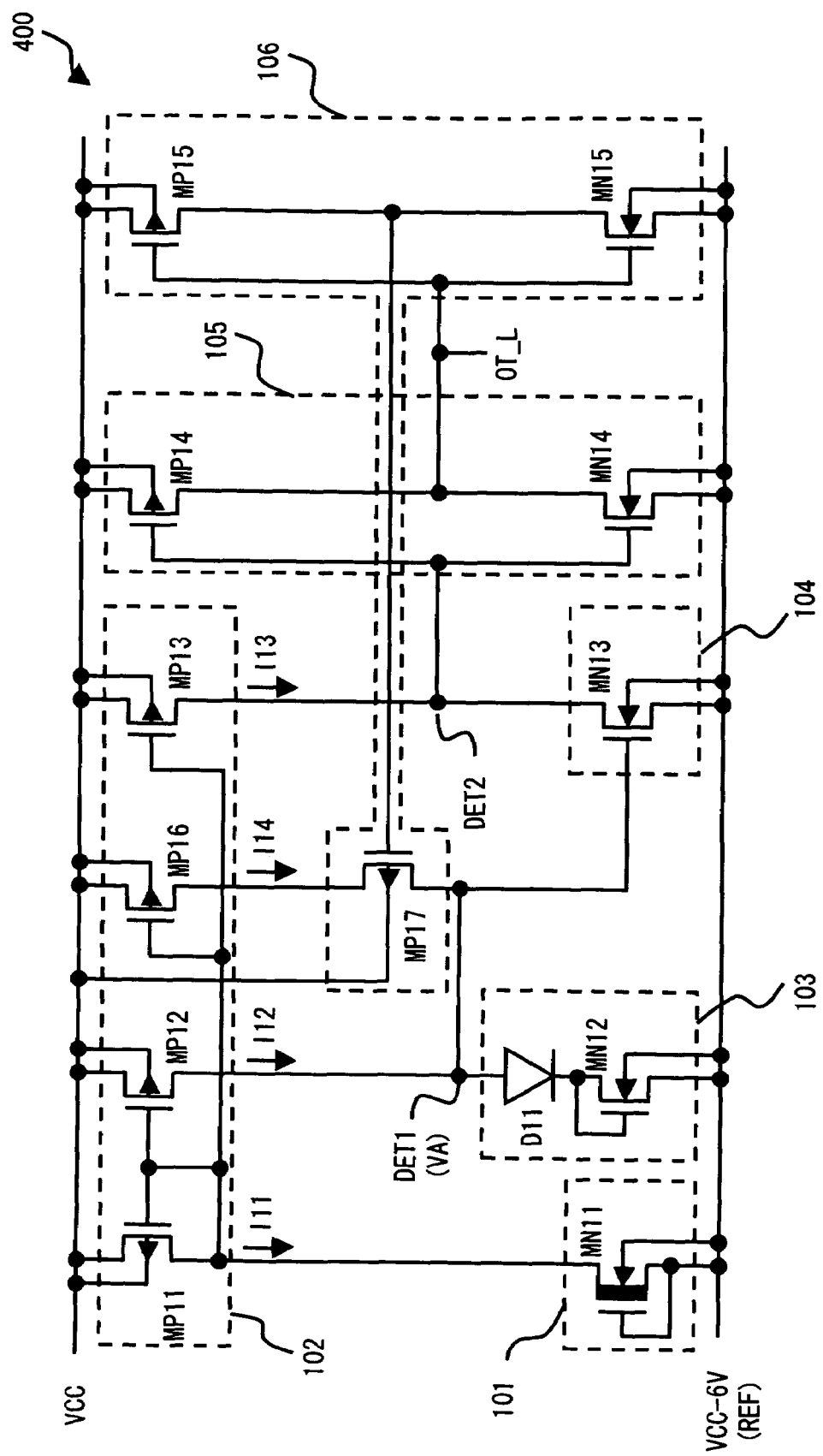
FIG. 4 is a circuit diagram showing an overheat detecting circuit according to a second embodiment of the present invention.

FIG. 4 shows an overheat detecting circuit 400 according to a second embodiment of the present invention. The overheat detecting circuit 400 of the second embodiment has substantially the same circuit configuration as the overheat detecting circuit 100 of the first embodiment. The overheat detecting circuit 400 of the second embodiment includes a PMOS transistor MP 16 in the current mirror circuit unit and a hysteresis circuit 106 in addition to the components of the overheat detecting circuit 100 of the first embodiment. The same components as those of the first embodiment are denoted by identical reference numerals, and their detailed description is omitted here.

The PMOS transistor MP 16 and the hysteresis circuit 106 are described in detail. The PMOS transistor MP 16 is a PMOS transistor added to the current mirror circuit unit, and has a source applied with the power supply voltage VCC, a gate connected with the gate of the PMOS transistor MP 11, and a drain connected with the hysteresis circuit 106.

The PMOS transistor MP 16 supplies a current I14 that gives a hysteresis to the overheat detection temperature of the overheat detecting circuit 400. Further, in the second embodiment, the sum of the current I12 and the current I14 is used to generate the voltage VA at the semiconductor substrate temperature that ranges from the ordinary temperature to the overheat detection temperature. Incidentally, amounts of each current are set to satisfy a relation of, for example, I11>(I12+I14)>I13.

The hysteresis circuit 106 includes an inverter composed of a PMOS transistor MP 15 and the NMOS transistor MN 15, and a PMOS transistor MP 17 connected between the PMOS transistor MP 16 and the node DET1. The PMOS transistor MP 17 has a source connected with a drain of the PMOS transistor MP 16, a source connected with the node DET1, and a gate receiving an inverted signal of the output OT_L through the inverter composed of the PMOS transistor MP 15 and the NMOS transistor MN 15.

An operation of the overheat detecting circuit 400 of the second embodiment is described. If the semiconductor substrate temperature is lower than the overheat detection temperature, the high-level voltage is generated as the output OT_L. Hence, a gate of the PMOS transistor MP 17 is applied with a low-level voltage. Thus, a current flows through the PMOS transistor MP 17, and the total current of the currents I12 and I14 is supplied to the overheat detecting element unit 103.

If the semiconductor substrate temperature is higher than the overheat detection temperature, the low-level voltage is generated as the output OT_L, so a gate of the PMOS transistor MP 17 is applied with a high-level voltage. As a result, no current flows through the PMOS transistor MP 17, and the current I12 is supplied to the overheat detecting element unit 103. In this case, a current supplied to the overheat detecting element unit 103 is smaller than that supplied before the detection of overheating and the voltage VA generated with the overheat detecting element unit 103 is lowered in accordance with the current I14.

That is, if the semiconductor substrate temperature drops after the overheat detecting circuit 400 detected overheating, the overheat detecting circuit 400 changes its output voltage from the low level to the high level again. However, when the overheat detecting circuit 400 detects overheating, the circuit needs to wait until the semiconductor substrate temperature is lowered down to the overheat detection temperature or lower in order that the voltage VA exceeds threshold voltage Vth2 of the NMOS transistor MN 13 while reducing an amount of current supplied to the overheat detecting element unit 103 to lower the voltage VA.

Accordingly, the overheat detecting circuit 400 of the second embodiment has hysteresis characteristics that the overheat detection temperature is 190° C., for example, and the overheat detection state is returned to the normal state at 180° C.

According to the overheat detecting circuit 400 of the second embodiment, similar to the first embodiment, the overheat detection temperature is set such that the voltage VA and the threshold voltage Vth2 are determined with reference to the reference voltage REF. Further, the voltage VA and the threshold voltage Vth2 are set based on the currents I12, I13, and I14 generated with the current mirror circuit unit in accordance with the current I11. Further, the NMOS transistor MN 12 and the NMOS transistor MN 13 are produced through substantially the same processes. Thus, the overheat detecting circuit 400 of the second embodiment involves less variation like the overheat detecting circuit 100 of the first embodiment.

Further, in the overheat detecting circuit 400 of the second embodiment, the overheat detection temperature has hysteresis characteristic, so the circuit operation is stabilized when overheating is detected as compared with the overheat detecting circuit 100 of the first embodiment.

Third Embodiment

Figure 5:
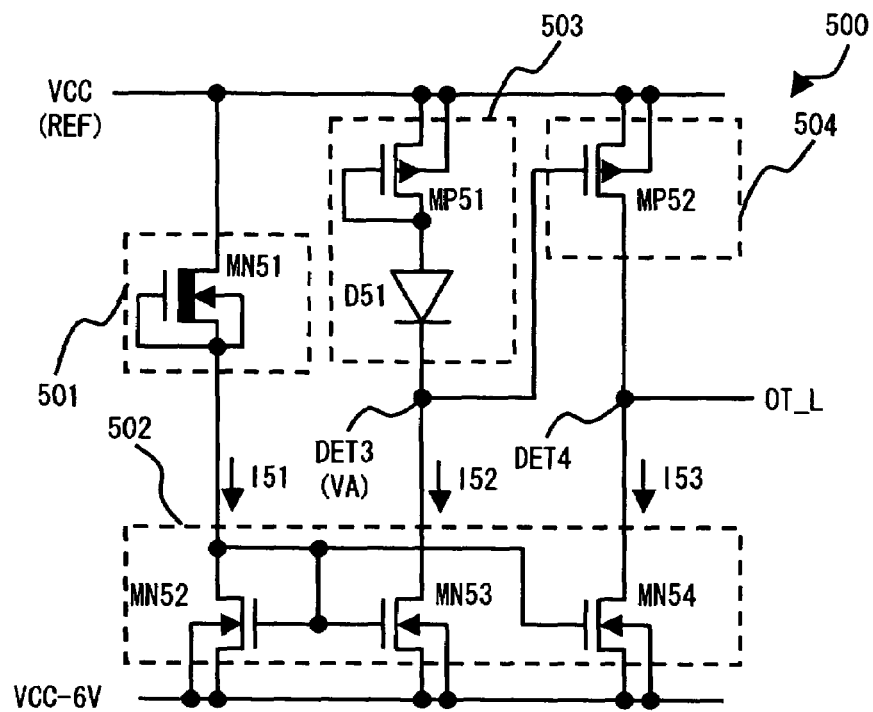
FIG. 5 is a circuit diagram showing an overheat detecting circuit according to a third embodiment of the present invention.

An overheat detecting circuit 500 according to a third embodiment of the present invention operates with the reference voltage REF set to the power supply voltage VCC, while the overheat detecting circuit 100 of the first embodiment operates with the reference voltage of (VCC-6 V). That is, the overheat detecting circuit 500 of the third embodiment operates in substantially the same manner as the overheat detecting circuit 100 of the first embodiment. An operation of the overheat detecting circuit 500 of the third embodiment is described. FIG. 5 is a circuit diagram showing the overheat detecting circuit 500 of the third embodiment. The overheat detecting circuit 500 of FIG. 5 includes a current source 501, a current mirror circuit unit 502, an overheat detecting element unit 503, and a detecting circuit unit 504.

In this embodiment, the current source 501 is a depletion type NMOS transistor MN 51. The transistor MN 51 has a gate connected with a source, a source connected with a drain of an NMOS transistor MN 52 of the current mirror circuit unit, and a drain applied with the power supply voltage VCC. The depletion type NMOS transistor MN 51 determines a value of a current I51 supplied to the NMOS transistor MN 52 based on preset values of the gate length L and the gate width W.

The current mirror circuit unit 502 includes NMOS transistors MN 52, MN 53, and MN 54. Each source of the NMOS transistors MN 52, MN 53, and MN 54 is applied with (VCC-6 V). A gate of the NMOS transistor MN 52 is connected with a drain, and gates of the NMOS transistors MN 53 and MN 54 are connected with a gate of the transistor MN 52.

The NMOS transistor MN 53 has a drain connected with the overheat detecting element unit 503. The NMOS transistor MN 53 supplies a current I52 in accordance with the current I51 supplied to the NMOS transistor MN 52 from the drain to the overheat detecting element unit 503. The NMOS transistor MN 54 has a drain connected with the detecting circuit unit 504. The NMOS transistor MN 54 supplies a current I53 in accordance with the current I51 supplied to the NMOS transistor MN 52 from the drain to the detecting circuit unit 504.

The overheat detecting element unit 503 has a diode D51 and a PMOS transistor MP 51. The PMOS transistor MP 51 has a source applied with the power supply voltage VCC, a gate connected with a drain, and the drain connected with an anode of the diode D11. A cathode of the diode D51 is connected with the drain of the NMOS transistor MN 53 through a node DET3.

In this embodiment, the detecting circuit unit 504 is a PMOS transistor MP 52. The PMOS transistor MP 52 has a source applied with the power supply voltage VCC, a drain connected with a drain of the NMOS transistor MN 54 through a node DET4, and a gate connected with the node DET3. Incidentally, the PMOS transistor MP 52 and the PMOS transistor MP 51 are produced through substantially the same processes.

The overheat detecting circuit 500 generates a high-level voltage as the output OT_L (for example, power supply voltage VCC) if the semiconductor substrate temperature is lower than the overheat detection temperature. The circuit generates a low-level voltage as the output OT_L (for example, VCC-6 V) when the semiconductor substrate temperature is higher than the overheat detection temperature. The overheat detection temperature is a semiconductor substrate temperature at which an output level of the overheat detecting circuit 500 is switched from the high level to the low level. That is, the output logic of the overheat detecting circuit 500 of the third embodiment is the same as that of the overheat detecting circuit 100 of the first embodiment.

Here, an operation of the overheat detecting element unit 503 and the detecting circuit unit 504 is omitted since the reference voltage is set to the power supply voltage VCC, and the detection principle thereof is the same as that of the overheat detecting element unit 103 and the detecting circuit unit 104 according to the first embodiment provided that the detection voltage is a potential difference from the power supply voltage VCC.

Next, an operation of the overheat detecting circuit 500 is described in detail. The overheat detecting circuit 500 operates with reference to the power supply voltage VCC.

Description is given of an example where the semiconductor substrate temperature is lower than the overheat detection temperature. First, the current source 501 generates the current I51. The generated current I51 is supplied to the overheat detecting element unit 503 by the NMOS transistor MN 53 of the current mirror circuit unit 502 as the current I52 and supplied to the detecting circuit unit 504 by the NMOS transistor MN 54 as the current I53.

Here, under the condition of the same gate length L, the currents I52 and I53 are determined based on a relation among the gate width W1 of the NMOS transistor MN 52, the gate width W2 of the NMOS transistor MN 53, and the gate width W3 of the NMOS transistor MN 54. In this embodiment, the currents are set to satisfy the relation of, for example, I51>I52>I53.

The overheat detecting element unit 503 generates the voltage VA at the node DET3 in accordance with an amount of the current I52. The voltage VA equals (VCC-1.30 V) when the semiconductor substrate temperature is the ordinary temperature.

The threshold voltage Vth2 of the PMOS transistor of the detecting circuit unit 504 equals (VCC-0.97 V) if the semiconductor substrate temperature is the ordinary temperature. Thus, if the voltage VA equals (VCC-1.30 V), the gate voltage of the PMOS transistor MP 52 is higher than the threshold voltage Vth2, so a current flows. Therefore, the current I53 supplied from the NMOS transistor MN 54 is supplied to the PMOS transistor MP 52, and the drain voltage of the PMOS transistor MP 52 is shifted to the high level. Accordingly, the overheat detecting circuit 500 generates the high-level voltage as the output OT_L.

Next, description is made of an example where the semiconductor substrate temperature is higher than the overheat detection temperature. First, the current source 501 generates the current I51. The generated current I51 is supplied to the overheat detecting element unit 503 by the NMOS transistor MN 53 of the current mirror circuit unit 502 as the current I52 and supplied by the NMOS transistor MN 54 as the current I53 to the detecting circuit unit 504.

The overheat detecting element unit 503 generates the voltage VA at the node DET3 in accordance with an amount of the current I52. The voltage VA equals (VCC-0.62 V) when the semiconductor substrate temperature is 195° C.

In the detecting circuit unit 504, the threshold voltage Vth2 of the PMOS transistor equals (VCC-0.63 V) when the semiconductor substrate temperature is 195° C. Thus, if the voltage VA equals (VCC-0.62 V), the gate voltage of the PMOS transistor MP 52 is lower than the threshold voltage Vth2, so no current flows. Hence, the drain voltage of the PMOS transistor MP 52 is shifted to the low level. Accordingly, the overheat detecting circuit 500 generates the low-level voltage as the output OT_L.

According to the overheat detecting circuit 500 of the third embodiment, similar to the first embodiment, the overheat detection temperature is set such that the voltage VA and the threshold voltage Vth2 are determined with a reference voltage (e.g. the power supply voltage VCC). Further, the voltage VA and the threshold voltage Vth2 are set based on the currents I52, I53, and I54 generated by the current mirror circuit unit in accordance with the current I51. Further, the PMOS transistor MP 51 and the PMOS transistor MP 52 are produced through substantially the same processes. Thus, the overheat detecting circuit 500 of the second embodiment involves less variation similar to the overheat detecting circuit 100 of the first embodiment.

Fourth Embodiment

Figure 6:
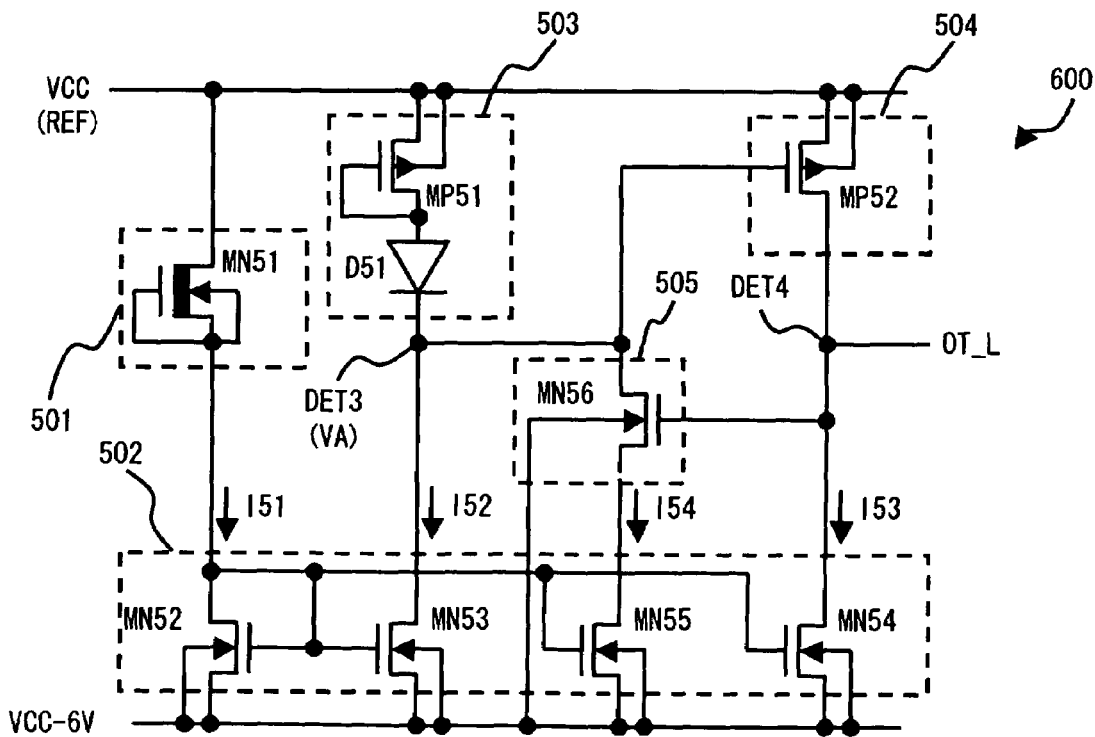
FIG. 6 is a circuit diagram showing an overheat detecting circuit according to a fourth embodiment of the present invention.
Figure 7:
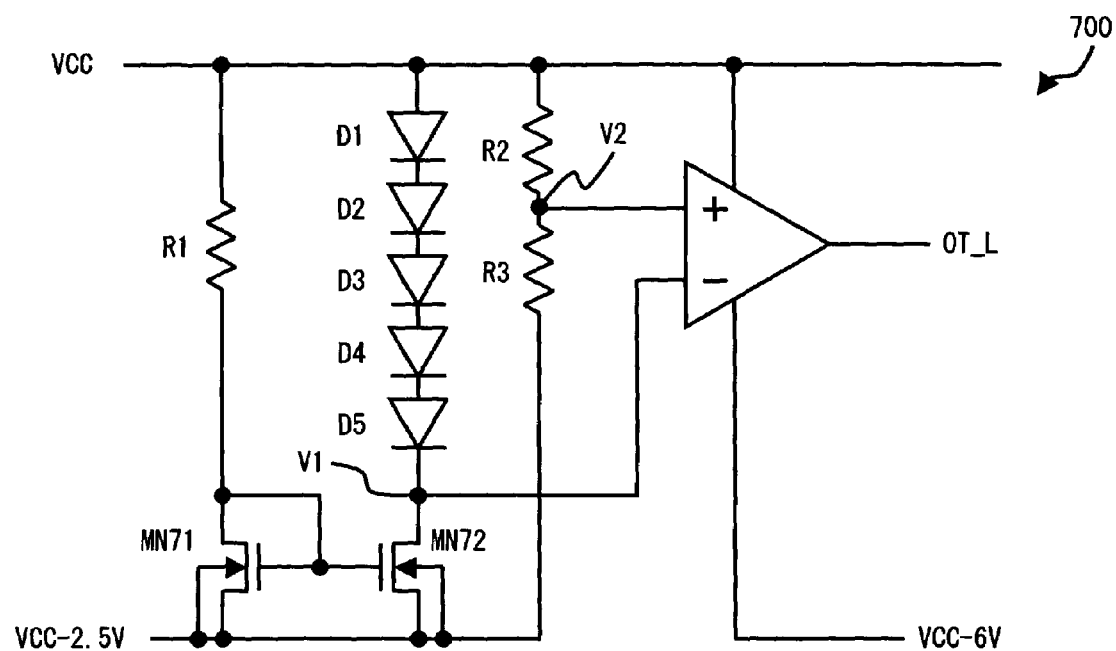
FIG. 7 is a circuit diagram showing a conventional overheat detecting circuit.

FIG. 6 shows an overheat detecting circuit 600 according to a fourth embodiment of the present invention. The overheat detecting circuit 600 of the fourth embodiment includes an NMOS transistor MN 55 in the current mirror circuit unit and a hysteresis circuit 505 in addition to the components of the overheat detecting circuit 500 of the third embodiment. The same components as those of the third embodiment are denoted by identical reference numerals, and their description is omitted here.

The NMOS transistor MN 55 and the hysteresis circuit 505 are described in detail. The NMOS transistor MN 55 is an NMOS transistor added to the current mirror circuit unit 502, and has a source applied with (VCC-6 V), a gate connected with the gate of the NMOS transistor MN 52, and a drain connected with the hysteresis circuit 505.

The NMOS transistor MN 55 supplies a current I54 that gives a hysteresis to the overheat detection temperature of the overheat detecting circuit 400. Further, in the fourth embodiment, the total current of the current I52 and the current I54 is used to generate the voltage VA at the semiconductor substrate temperature that ranges from the ordinary temperature to the overheat detection temperature. Incidentally, the respective currents are set to satisfy the relation of, for example, I51>(I52+I54)>I53.

In this embodiment, the hysteresis circuit 505 is an NMOS transistor MN 56 connected with the node DET1. The NMOS transistor MN 56 has a source connected with a drain of the NMOS transistor MN 55, a source connected with the node DET3, and a gate applied with the output OT_L.

An operation of the overheat detecting circuit 600 of the fourth embodiment is described. If the semiconductor substrate temperature is lower than the overheat detection temperature, the circuit generates a high-level voltage as the output OT_L. Thus, the gate of the NMOS transistor MN 56 is applied with a high-level voltage. Thus, a current flows through the NMOS transistor MN 56, and the total current of the currents I52 and I54 is supplied to the overheat detecting element unit 503.

If the semiconductor substrate temperature is higher than the overheat detection temperature, the low-level voltage is generated as the output OT_L, so the gate of the NMOS transistor MN 56 is applied with the low-level voltage. Thus, no current flows through the NMOS transistor MN 56, and the current I52 is supplied to the overheat detecting element unit 503. In this case, an amount of current supplied to the overheat detecting element unit 503 is smaller than that supplied before the detection of overheating, so the voltage VA generated with the overheat detecting element unit 503 is lowered in accordance with the current I54.

That is, if the semiconductor substrate temperature drops after the overheat detecting circuit 600 detected overheating, the overheat detecting circuit 600 changes an output level from the low level to the high level again. However, if the overheat detecting circuit 600 detects overheating, the circuit should wait until the semiconductor substrate temperature is lowered down to the overheat detection temperature or lower in order that the voltage VA is lower than the threshold voltage Vth2 of the PMOS transistor MP 52 to reduce a current supplied to the overheat detecting element unit 503.

Accordingly, the overheat detecting circuit 600 of the fourth embodiment has hysteresis characteristics that the overheat detection temperature is 190° C., for example, and the temperature at which the overheat detection state is returned to the normal state is 180° C.

According to the overheat detecting circuit 600 of the fourth embodiment, similar to the third embodiment, the overheat detection temperature is set such that the voltage VA and the threshold voltage Vth2 are determined with a reference voltage (e.g. the power supply voltage VCC). Further, the currents I52, I53, and I54 generated with the current mirror circuit unit based on the current I51 are used to set the voltage VA and the threshold voltage Vth2. Further, the PMOS transistor MP 51 and the PMOS transistor MP 52 are produced through substantially the same processes. Thus, the overheat detecting circuit 600 of the fourth embodiment involves less variation like the overheat detecting circuit 500 of the third embodiment.

Further, since the overheat detecting circuit 600 of the fourth embodiment gives the hysteresis to the overheat detection temperature, when overheating is detected, the circuit can operate more stably than the overheat detecting circuit 500 of the third embodiment.

It is apparent that the present invention is not limited to the above embodiment that may be modified and changed without departing from the scope and spirit of the invention.

What is claimed is:

1. An overheat detecting circuit, comprising:
a current source for generating a constant current;
an overheat detecting element unit that operates with a first current generated in accordance with the constant current and generates a first voltage based on a semiconductor substrate temperature; and
a detecting circuit unit that operates with a second current generated in accordance with the constant current, and generates a second voltage corresponding to a predetermined semiconductor substrate temperature to detect overheating based on a voltage difference between the first voltage and a reference voltage and a voltage difference between the second voltage and the reference voltage.

2. The overheat detecting circuit according to claim 1, wherein when the constant current increases, the voltage difference between the first voltage and the reference voltage and the voltage difference between the second voltage and the reference voltage increase, and when the constant current is reduced, the voltage difference between the first voltage and the reference voltage and the voltage difference between the second voltage and the reference voltage decrease.

3. The overheat detecting circuit according to claim 1, wherein the overheat detecting element unit changes the first voltage based in a temperature characteristic of an element.

4. The overheat detecting circuit according to claim 1, wherein a temperature characteristic of the first voltage involves a larger change amount than a temperature characteristic of the second voltage.

5. The overheat detecting circuit according to claim 1, wherein a change amount of the first voltage based on a change in the constant current and a change amount of the second voltage are substantially the same.

6. The overheat detecting circuit according to claim 1, wherein the first voltage and the second voltage are generated by elements that are produced through substantially the same process.

7. The overheat detecting circuit according to claim 1, wherein the constant current is larger than the first current and the first current is larger than the second current.

8. The overheat detecting circuit according to claim 1, wherein when the voltage difference between the second voltage and the reference voltage is larger than the voltage difference between the first voltage and the reference voltage, the detecting circuit unit outputs a signal indicating that the semiconductor substrate temperature exceeds the detection temperature.

9. The overheat detecting circuit according to claim 1, wherein the overheat detecting circuit has hysteresis characteristic of the overheat detection temperature.

10. The overheat detecting circuit of claim 9, wherein said hysteresis characteristic is due to a hysteresis circuit comprising:

a PMOS transistor and an NMOS transistor serially interconnected such as to be in parallel with said current source, a gate of said PMOS transistor and a gate of said NMOS transistor receiving an overtemperature output signal of said overheat detecting;

a third current generated in accordance with said constant current; and a transistor through which flows said third current, a source of said transistor connected to said first voltage, a gate of said transistor being connected to a node between said serially interconnected PMOS and NMOS transistors.

11. The overheat detection circuit of claim 1, wherein said detecting circuit unit receives said first voltage as an input signal.

12. The overheat detection circuit of claim 1, wherein said detecting circuit detects said overheating based on comparing, relative to said reference voltage, said first voltage with said second voltage.

13. The overheat detection circuit of claim 1, wherein said current source is connected between a power supply voltage and said reference voltage, said power supply being referenced to a ground, and said reference voltage comprises a voltage preset a predetermined amount below said power supply voltage.

14. The overheat detection circuit of claim 1, wherein said overheat detection element comprises a diode.

15. The overheat detection circuit of claim 14, wherein said overheat detection element further comprises a transistor serially connected with said diode.

16. The overheat detection circuit of claim 1, wherein said detecting circuit unit comprises a transistor having a gate controlled by said first voltage.

17. The overheat detection circuit of claim 1, wherein said constant current, said first current, and said second current are generated by a plurality of PMOS transistors interconnected as current mirrors.

18. The overheat detecting circuit of claim 1, wherein said constant current, said first current, and said second current are generated by a plurality of NMOS transistors interconnected as current mirrors.

19. An overheat detecting circuit, comprising:

a current source for generating a constant current;

an overheat detecting element unit that operates with a first current generated in accordance with the constant current and generates a first voltage based on a semiconductor substrate temperature; and a detecting circuit unit that operates a second current generated in accordance with the constant current, said detecting circuit generating a second voltage corresponding to a predetermined semiconductor substrate temperature to detect overheating, said detecting circuit being activated by said first voltage when an overheat condition has been sensed by said overheat detecting element.

20. A method of detecting an overheat condition, said method comprising:

generating constant current;

operating an overheat detecting element unit with a first current generated in accordance with the constant current;

generating a first voltage by said overheat detecting element, based on a semiconductor substrate temperature;

operating a detecting circuit unit with a second current generated in accordance with the constant current, said detecting circuit generating a second voltage corresponding to a predetermined semiconductor substrate temperature to detect overheating; and activating said detecting circuit by said first voltage when an overheat condition has been sensed by said overheat detecting element.

* * * * *